United States Patent [19]
Rosen

[11] Patent Number: 6,166,564
[45] Date of Patent: Dec. 26, 2000

[54] CONTROL CIRCUIT FOR CLOCK ENABLE STAGING

[75] Inventor: Eitan E. Rosen, Haifa, Israel

[73] Assignee: Intel Corporation, Santa Clara, Calif.

[21] Appl. No.: 09/350,734

[22] Filed: Jul. 9, 1999

[51] Int. Cl.[7] .................................................. H03K 19/00
[52] U.S. Cl. .............................................. 326/93; 326/94
[58] Field of Search .................................. 326/93, 96, 97, 326/98

[56] References Cited

U.S. PATENT DOCUMENTS

| | | | |
|---|---|---|---|
| 5,151,623 | 9/1992 | Agrawal | 326/93 |
| 5,939,898 | 8/1999 | Henkel et al. | 326/93 |
| 6,005,416 | 12/1999 | Beakes et al. | 326/96 |

*Primary Examiner*—Trong Phan
*Attorney, Agent, or Firm*—Blakely, Sokoloff, Taylor & Zafman LLP

[57] ABSTRACT

A control circuit for clock enable staging between first and second clock macros wherein each clock macro produces a clock signal at an output in response to a transition of a global clock signal when an enable signal has been activated. The control circuit comprises a latch element having a first input coupled to the output of the first clock macro, a second input of the latch element is coupled to the output of the second clock macro, and an output node coupled to the enable input of the second clock macro. The output node of the latch element activates the enable input of the second clock macro responsive to the clock signal at the output of the first clock macro, and inactivates the enable input of the second clock macro responsive to the clock signal at the output of the second clock macro.

26 Claims, 8 Drawing Sheets

CONTROL CIRCUIT FOR CLOCK ENABLE STAGING

FIELD OF THE INVENTION

The present invention relates to the field of computers and computer systems. In particular, the invention relates to apparatus and methods incorporated within an integrated circuit (IC), such as a microprocessor, for controlling clock cycles.

BACKGROUND OF THE INVENTION

In many ICs there is a need to synchronize events such as the transfer of data between logic elements. For example, many microprocessors latch data and flip-flop devices synchronous to the rising or falling edge of a clock signal. In modern integrated circuits, clock macros are typically utilized to trigger activity in particular blocks of logic.

A clock macro is a well-known circuit structure that buffers and conditions a clock signal coupled to a set of the state elements, usually a small state machine. The clock macro is typically driven by a global clock signal, with individual clock macros being enabled by a separate enable signal line. The enable line allows a clock macro to generate a clock signal for a particular set of logic at a particular time. Normally, the state elements and their associated clock macro circuits are arranged in a pipeline configuration so the data flow proceeds in a synchronous manner through the circuit.

Such a pipelined circuit arrangement is illustrated in FIG. 1, where three separate clock macro circuits ($Macro_{1-3}$) are shown driving associated flip-flop state elements ($FF_{1-3}$). Data flow proceeds from left to right in the schematic diagram of FIG. 1. Each set of state elements may drive associated machine logic (e.g., combinatorial logic) as indicated by blocks $M_1$ and $M_2$ in FIG. 1. Each clock macro functions to generate a single clock pulse cycle responsive to a rising edge of the global clock signal (GCLK) when its enable (EN) input is logically high.

An example of the functionality of the pipelined circuit arrangement of FIG. 1 is provided in the timing diagram of FIG. 2. As can be seen, the $Cycle_1$ output pulse is generated in response to the first rising edge of the global clock signal when the enable input $EN_1$ is high. A second $Cycle_1$ output pulse is also generated responsive to the second rising edge of the GCLK signal since the $EN_1$ signal is still high when the second GCLK signal arrives. In accordance with pipelined structure of the circuit of FIG. 1, the second clock macro is supposed to output a clock pulse ($Cycle_2$) one clock cycle after the occurrence of the $Cycle_1$ output pulse. This is indicated in the timing diagram of FIG. 2 by arrow 11. This requires, of course, that the enable input $EN_2$ be high when the second GCLK pulse transitions low-to-high.

Continuing down the pipeline, the third clock macro should output a clock pulse ($Cycle_3$) one clock cycle after the occurrence of the $Cycle_2$ output pulse when the second GCLK pulse transitions low-to-high and the enable input $EN_3$ is high. This is indicated in the timing diagram of FIG. 2 by arrow 13. The remaining stages of the pipeline (not shown) operate in a similar manner. Likewise, arrows 12 and 14 in FIG. 2 represent the causal effect of the second $Cycle_1$ output pulse.

In other words, the correct sequence of events is as follows. Data is first provided to the inputs of $FF_1$, after which time Clock $Macro_1$ provides a pulsed clock signal ($Cycle_1$) to the state elements of $FF_1$ responsive to the rising edge of GCLK when $EN_1$ is high. After the outputs of $FF_1$ pass through some combinatorial logic ($M_1$) a next set of inputs is provided to $FF_2$. At the next rising edge of the global clock, $EN_2$ should be high clock such that Clock $Macro_2$ generates a pulsed clock signal ($Cycle_2$), and so on down the pipeline.

Note that the $EN_2$ and $EN_3$ signal inputs are not shown in FIG. 2, but would need to be provided to the corresponding clock macros at the same time that the next global clock signal arrives.

One difficulty in the prior art has been how to properly generate and sequence each of the enable input signals to the respective clock macros in the pipelined logic chain. In other words, although the clock macros are connected to the same global clock signal—which gives them proper timing—each clock macro lacks the logical decision whether to generate an output pulse. That logical decision is provided by the enable input signal.

The circuit schematic diagram of FIG. 3 shows one prior art approach to this problem. In FIG. 3, an enable input signal is provided as an input to Clock $Macro_1$ and also to the data input of flip-flop 30a. Flip-flop 30a is the first in a series of flip-flops 30 that continues for as long as the pipeline extends. The output of flip-flop 30a drives the enable input of the next clock macro in the sequence (i.e., Clock $Macro_2$) and also the data input of the next enable flip-flop, i.e., 30b. Flip-flops 30 are all clocked synchronously on clock line 29 by inverter 28, which runs off GCLK.

A major disadvantage of the circuit of FIG. 3 is that it consumes a large amount of standby power due to the free running clock signal provided on line 29. In other words, each of the flip-flops 30 operates continuously to provide appropriate enable signals to each of the clock macro stages. As the size of integrated circuits continues to increase, the emphasis on power reduction has never been greater. This means that there is a need to provide alternative circuit solutions that do not consume such large quantities of power.

Another problem with prior art circuits is that the timing constraint on the enable signal comes from flip-flops 30. This places an additional constraint on the enable signal for next-phase staging. In next-phase staging, instead of providing a clock output pulse every global clock cycle, a pulse is provided every phase of the free running clock. This extra constraint requires additional latch circuits (shown as dashed elements 35 in FIG. 3) for proper phase staging. Thus, there exists an unsatisfied need for control circuit that provides proper clock enable staging while overcoming the drawbacks of the prior art.

SUMMARY OF THE INVENTION

A control circuit for clock enable staging between first and second clock macros is provided. Each clock macro produces a clock signal at an output in response to a transition of a global clock signal when an enable signal has been activated. In one embodiment, the control circuit comprises a latch element having a first input coupled to the output of the first clock macro. A second input of the latch element is coupled to the output of the second clock macro, and an output node coupled to the enable input of the second clock macro. The output node of the latch element activates the enable input of the second clock macro responsive to the clock signal at the output of the first clock macro. Additionally, the output node of the latch element inactivates the enable input of the second clock macro responsive to the clock signal at the output of the second clock macro.

BRIEF DESCRIPTION OF THE DRAWINGS

The present invention will be understood more fully from the detailed which follows and from the accompanying drawings, which however, should not be taken to limit the invention to the specific embodiments shown, but are for explanation and understanding only.

DETAILED DESCRIPTION

A control circuit for clock enable staging between clock macros is described. In the following description numerous specific details are set forth, such as specific operating states, signals, logic circuits, etc., in order to provide a thorough understanding of the present invention. It will be obvious, however, to one skilled in the art, that these specific details may not be needed to practice the present invention.

The invention replaces the free running clock and state element (e.g., flip-flop 30) of the prior art approach with a simple domino or set dominant latch (SDL) to stage enable information for clock generation. According to the present invention, the enabled clock output of a previous macro stage is utilized to enable the next stage clock macro circuitry. The present invention therefore saves power and area by not relying on a free running clock to stage the enable inputs of the pipelined macros. The first clock a pulse output in the pipeline activates or "sets" the control circuit of the present invention. Hence, there is no need to latch the enable signal using a free running clock. In other words, the output of the control circuit serves as the enable signal to the next clock pulse generator.

The clock pulse output of the second clock macro is utilized to reset the control circuit of the present invention, except in the case where the first clock macro is pulsed successively at the next rising edge of the global clock signal. This means that there is no need to use a free running clock to "clear" a latch.

Figure 1:
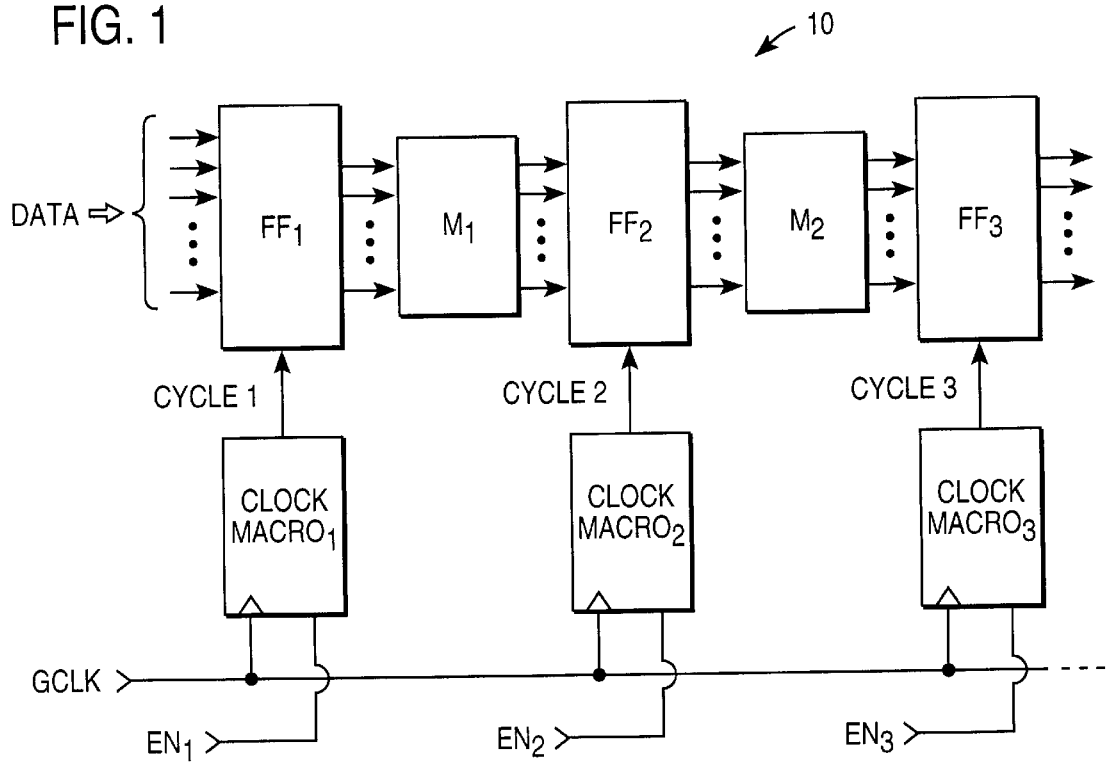
FIG. 1 is a circuit schematic diagram of a pipeline of logic in an integrated circuit in which timing of the logic elements is governed by clock macros.
Figure 2:
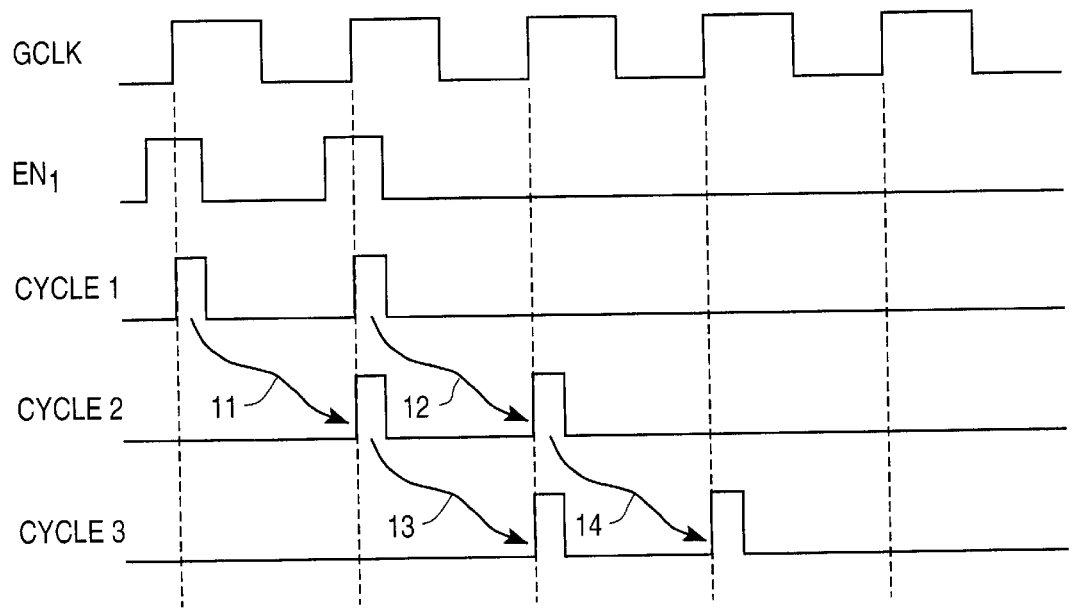
FIG. 2 is a timing diagram associated with FIG. 1.
Figure 3:
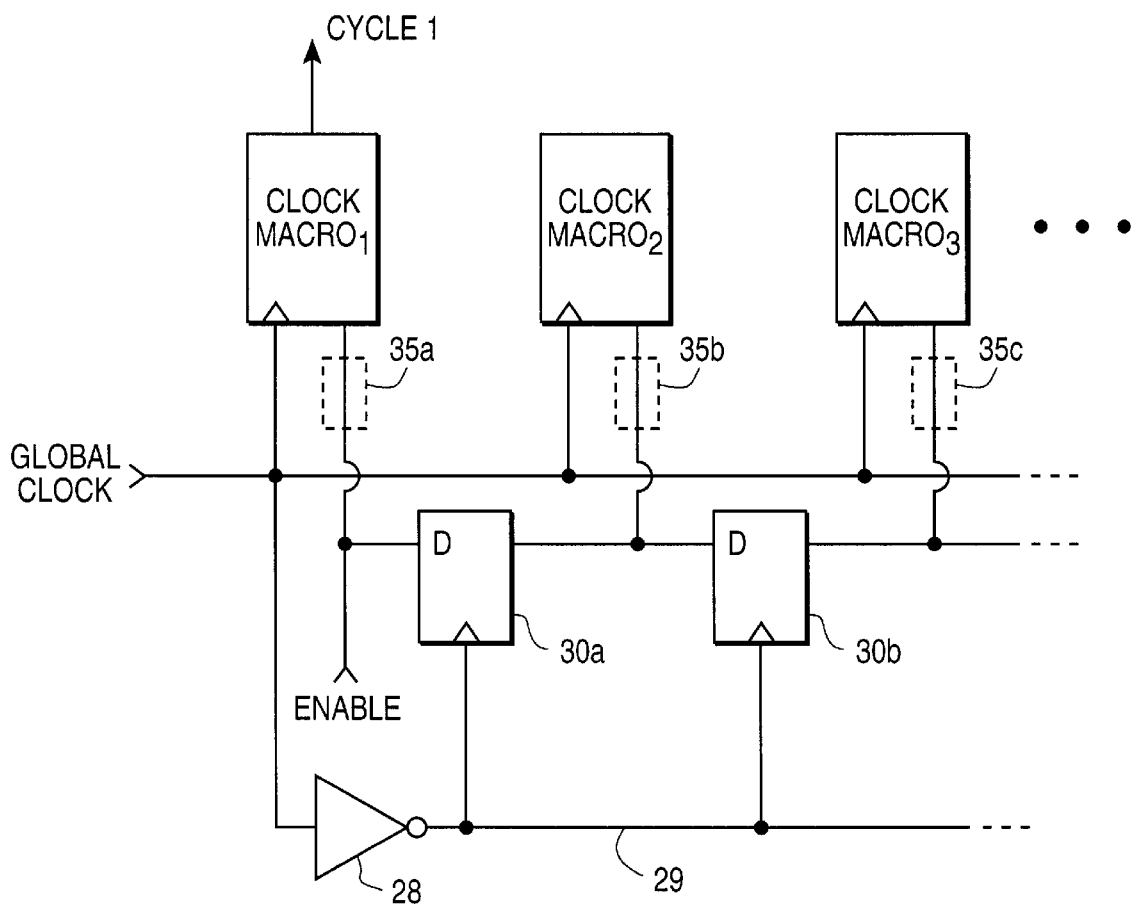
FIG. 3 is a circuit schematic diagram of a prior art clock enable staging scheme.
Figure 4:
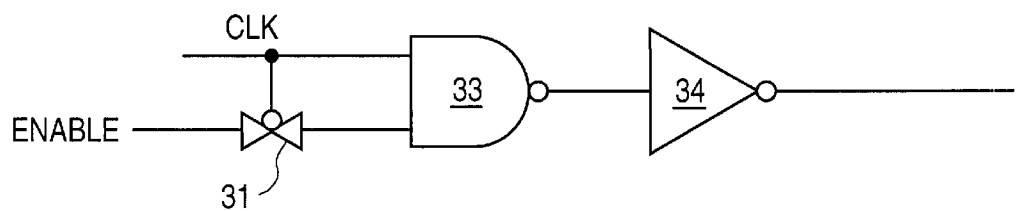
FIG. 4 shows logic implementing a prior art clock macro.
Figure 5:
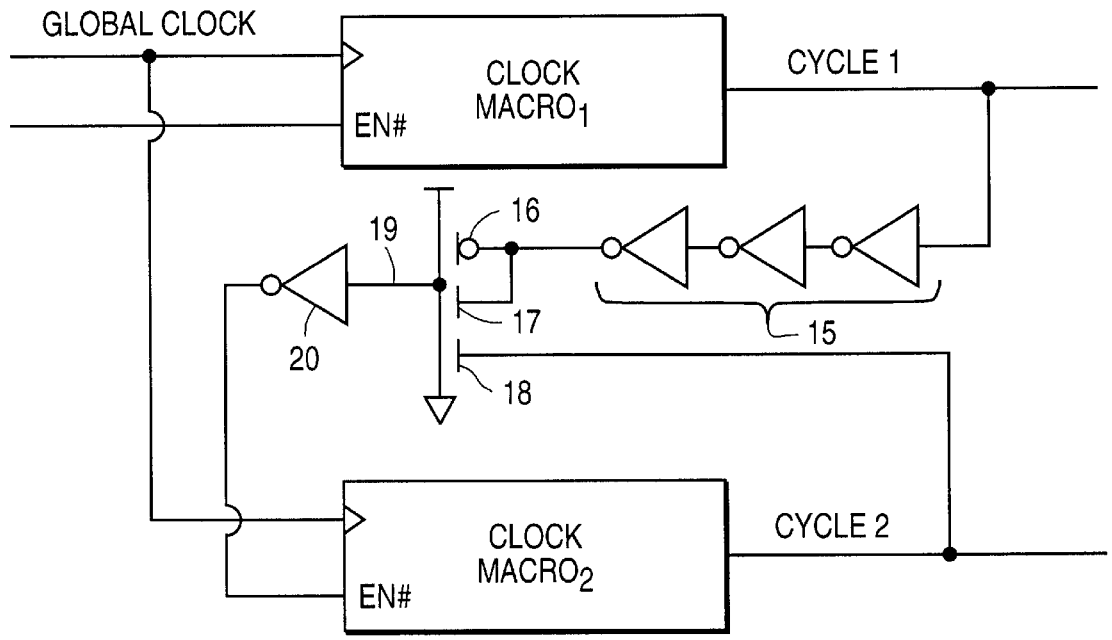
FIG. 5 is a circuit schematic diagram of a control circuit according to one embodiment of the present invention for cycle-to-cycle staging.

FIG. 5 illustrates one embodiment of a control circuit for clock enable staging between clock macros in accordance with the present invention. As can be seen, the first clock macro is coupled to receive the global clock signal and an enable input signal. The control circuit of FIG. 5 has two inputs: one each coupled to the clock cycle output of the respective clock macros (e.g., $cycle_1$ and $cycle_2$). The output signal of the control circuit (i.e., the output of inverter 20) is used to enable the second clock macro. Note that the second clock macro is also coupled to receive the global clock signal.

The control circuit of FIG. 5 comprises a set dominant latch (SDL) that includes a PMOS device 16 coupled between a supply potential (e.g., $V_{cc}$) and node 19. The SDL further comprises a pair of NMOS devices 17 and 18 coupled in series between node 19 and ground. The gates of PMOS device 16 and NMOS device 17 are both connected to the output of an inverter chain 15. Inverter chain 15 comprises three inverters connected in series, and is driven by the $cycle_1$ output of clock $macro_1$. The gate of NMOS device 18 is coupled to the $cycle_2$ output of clock $macro_2$. To complete the control circuit, output node 19 is coupled to the enable input of clock $macro_2$ through an inverter 14. (Note that the enable inputs of each of the clock macros is asserted low, i.e., as denoted by EN#).

Practitioners in the art will appreciate that the SDL structure confers a kind of "priority" to one NMOS device over the other. In FIG. 5, for example, if NMOS device 17 is off, then PMOS device 16 is on and node 19 is high irrespective of the on/off condition of NMOS device 18. If NMOS device 17 is on, this means that PMOS device 16 is off, and node 19 discharges when NMOS device 18 is on; that is, both NMOS devices 17 and 18 must be on to discharge node 19. But node 19 is charged based on the state of NMOS device 17 irrespective of NMOS device 18.

Figure 14:
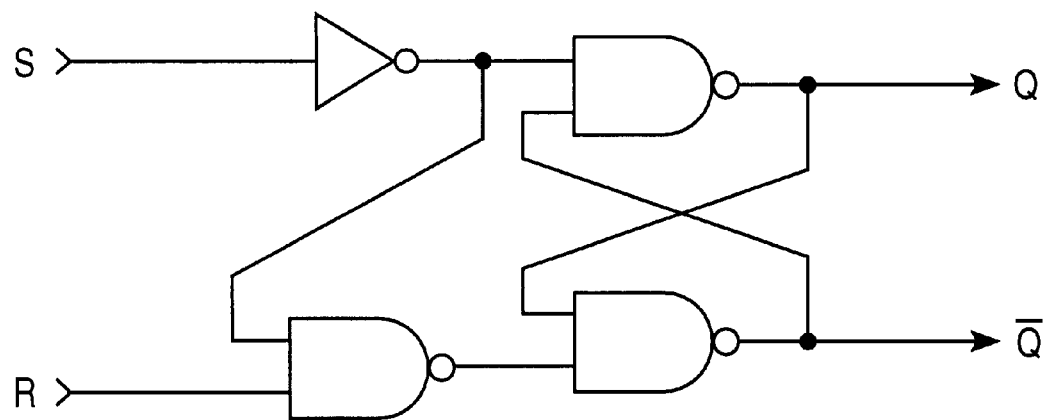
FIG. 14 is circuit schematic diagram of a set dominant latch.
Figure 15:
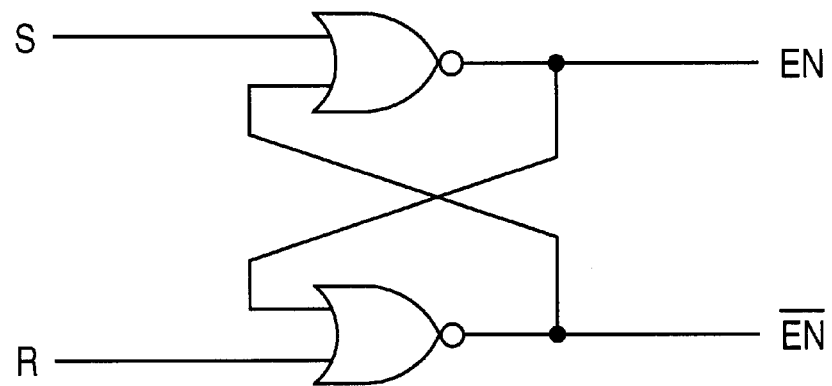
FIG. 15 is a circuit schematic diagram of a basic S-R type of flip-flop.

The same SDL function may also be realized in the circuit configuration of FIG. 14, which shows a simple static implementation of a set dominant latch. Note that the Q# output in FIG. 14 may provide the EN# signal coupled to the clock macro in FIG. 5. FIG. 15 shows another embodiment that may be utilized in the control circuit of the present invention. In this case, a simple set-reset flip-flop provides EN and EN# outputs signals. (Practitioners will appreciate that the static implementations of FIGS. 14 & 15 may need additional buffering to prevent minimum delay problems.)

At this point it should be appreciated that the essence of the present invention lies in the usage of an asynchronous element, such as a set-reset flip-flop, to provide race-free clock staging. Because these elements are coupled to clocked signals, they behave in a fully synchronous manner; however, without the considerable power dissipated in prior art designs. The present invention therefore reduces power consumption while simplifying logic verification and timing analysis.

To better understand the operation of the control circuit shown in FIG. 5, consider what happens when the $cycle_1$ output fires (i.e., pulses) in response to a rising edge of GCLK when the EN# input of clock $macro_1$ is activated (low). When the $cycle_1$ output transitions high, the gates of PMOS device 16 and NMOS device 17 both transition low.

This produces a high logic level at output node 19, regardless of the gate voltage of NMOS device 18. With output node 19 high, the EN# input of clock macro₂ is activated via inverter 20. This, in turn, causes clock macro₂ to produce a clock pulse at its cycle₂ output in response to the next rising edge of GCLK, as desired.

When the cycle₂ output transitions high at the beginning of the next global clock cycle, the cycle₁ output is low (assuming that the EN# input of clock macro₁ has not been activated). With the cycle₁ output low, PMOS device 16 is off (its gate voltage is high due to inverter chain 15) and NMOS device 17 is turned on. At this time NMOS device 18 is also turned on due to the high voltage provided by the cycle₂ output. This situation causes node 19 to be discharged to ground, with inverter 20 de-activating the EN# input of clock macro₂ (EN# transitions high).

Another way of thinking about the control circuit of FIG. 5 is as a simple set-reset flip-flop, with the cycle₁ output providing the "set" input signal and the cycle₂ output providing the "reset" input signal. In the case where the EN# input of clock macro₁ is activated for consecutive GCLK cycles, the set dominant feature of the control circuit insures that clock macro₂ is likewise activated for consecutive cycles.

Practitioners in the art will further understand that the SDL structure of the invention acts as a contention prevention element. The reason why is because even if all of the gates of devices 16–18 are high (or low), current does not flow through the series connection of devices 16–18 from $V_{cc}$ to ground.

It is appreciated that if the delay from the cycle₁ output to the enable input of clock macro₂ were very short, it might be possible for the cycle₂ output to pulse during the same GCLK as the cycle₁ output. In other words, the cycle₂ output would pulse at the same time that the cycle₁ output was high. This, of course, would defeat the desired functionality of the circuit. To avoid this possibility, inverter chain 15 is included to provide sufficient delay in the cycle₁ signal path through the SDL element. Thus, inverter chain 15 prevents minimum delay problems with respect to both the rising and falling edges of the pulsed cycle₁ output signal. Those skilled in the art will understand that the same result can be achieved with numerous other circuit elements, such as ordinary clock chopper, or latch circuits.

Figure 6:
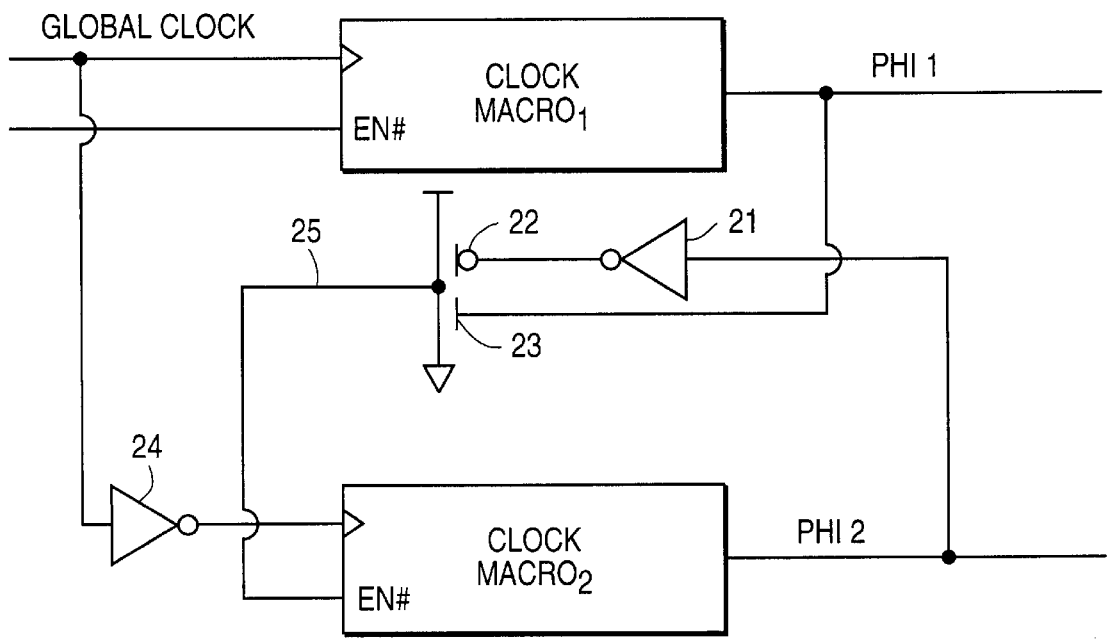
FIG. 6 is a circuit schematic diagram of a control circuit according to another embodiment of the present invention for next-phase staging.

FIG. 6 illustrates a control circuit in accordance with the present invention that is suitable for use in next phase staging. Unlike clock enable staging, next phase staging is designed to provide a clock output pulse with every phase of the global clock signal (when enabled). In the control circuit of FIG. 6, the rising edge and falling edge transitions of the clock macro output signal are used as a causal event to provide next-stage enable timing. In this respect, note that the clock macro outputs in FIG. 6 are denoted as phase signals Phi₁ and Phi₂.

The control circuit of FIG. 6 comprises a PMOS device 22 coupled between a supply potential (e.g., $V_{cc}$) and an output node 25. A NMOS device 23 is coupled between output node 25 and ground, with node 25 also being connected to the EN# input of clock macro₂. The gate of PMOS device 22 is coupled to the Phi₂ output through inverter 21, while the gate of NMOS device 23 is coupled directly to the Phi₁ output of clock macro₁. In accordance with proper next-phase functionality, the GCLK signal is provided to clock macro₂ via inverter 24. In certain implementations it may be desirable to couple an ordinary sustainer device to node 25.

In operation, when the Phi₁ output transitions high, NMOS device 23 turns on and discharges node 25, thereby activating the EN# input of clock macro₂. In the next clock phase when GCLK falls, the Phi₂ output transitions high, which, in turn, drives the gate of PMOS device 22 low. With its gate low, PMOS device 22 is turned on, and node 25 is charged to $V_{cc}$ such that the EN# input of clock macro₂ is inactivate once again. An important characteristic of the circuit shown in FIG. 6 is that the Phi₁ and Phi₂ outputs are ensured not to fire simultaneously.

Figure 7:
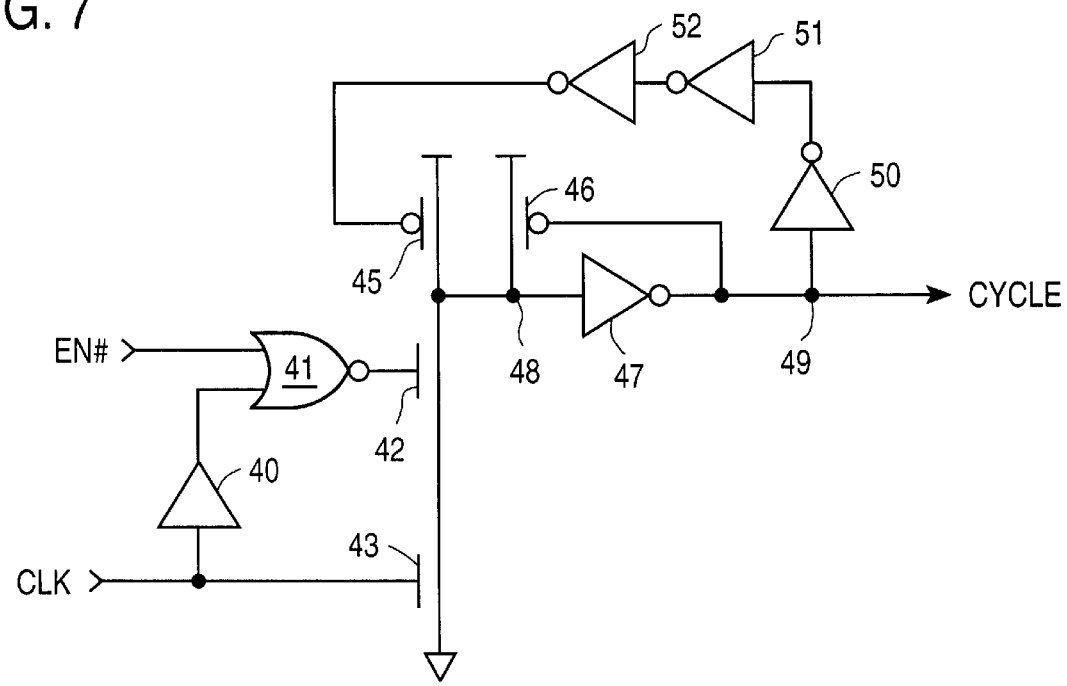
FIG. 7 is a circuit schematic diagram of one implementation of a clock macro in accordance with the present invention.

FIG. 7 illustrates one possible implementation of a pulsed clock macro circuit that may be employed in conjunction with the present invention. The clock macro circuit comprises a PMOS transistor 45 coupled between $V_{cc}$ and node 48. A PMOS transistor 46 is also coupled between $V_{cc}$ and node 48. Inverter 47 is coupled between nodes 48 and 49 to drive the output clock pulse. NMOS transistors 42 & 43 are coupled in series between node 48 and ground. The gate of NMOS transistor 42 is coupled to the output of NOR gate 41, which has one input coupled to EN# and the other input coupled to a CLK input via buffer 40. The gate of NMOS transistor 42 is coupled directly to the CLK input. Output node 49 is coupled to the gate of PMOS transistor 46, and also to the gate of PMOS transistor 45 via the inverter chain comprising inverters 50–52. This feedback connection limits the duration of the output clock pulse.

Figure 8:
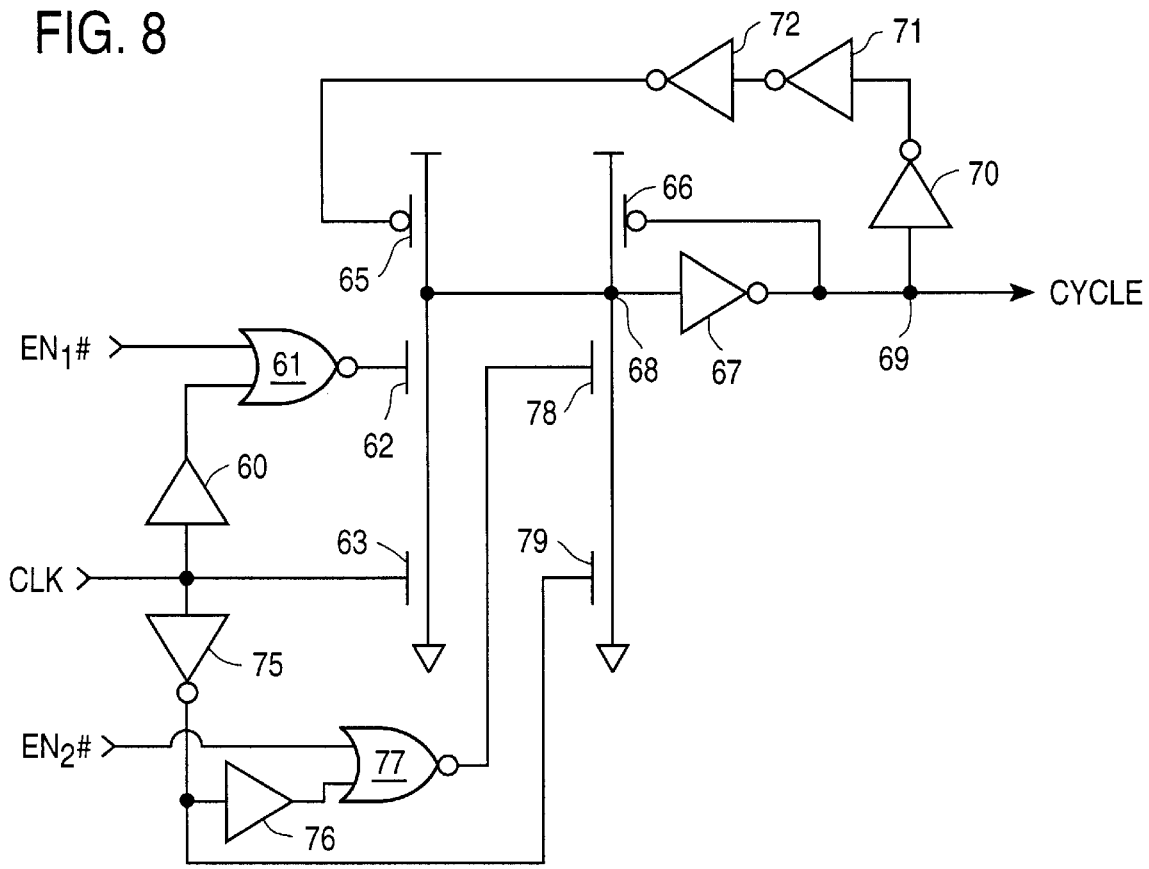
FIG. 8 is a circuit schematic diagram of another implementation of a clock macro in accordance with the present invention.

FIG. 8 is an alternative embodiment of a clock macro having two enable inputs to permit enable staging for both the rising and falling edges of the global clock signal. The clock macro circuit shown in FIG. 8 is useful for applications that rely upon high frequency data operations. Essentially, the clock macro circuit of FIG. 8 consists of two clock macros coupled in parallel, both being connected to the same global clock signal, but each having its own dedicated enable input.

The clock macro circuit comprises PMOS transistors 65 & 66 coupled in parallel between $V_{cc}$ and node 68. The gate of PMOS transistor 66 is coupled to output node 69, with the gate of PMOS transistor 65 being coupled to output node 69 through a series of inverters 70–72. Inverter 67 is coupled between nodes 68 and output node 69. NMOS transistors 78 & 79 are shown coupled in series between node 68 and ground. Another pair of NMOS transistors 62 & 63 is also coupled in series between node 68 and ground. The gates of NMOS transistors 62 & 78 are coupled to the output of NOR gates 61 and 77, respectively. The gate of NMOS transistor 62 is coupled directly to the CLK input, while the gate of NMOS transistor 79 is coupled to the CLK input through inverter 75. NOR gate 61 has one input coupled to CLK through buffer 60, and the other input coupled to receive the EN₁# signal. NOR gate 77 has one input coupled to EN₂# and the other input coupled to CLK via inverters 75 and buffer 76.

Figure 9:
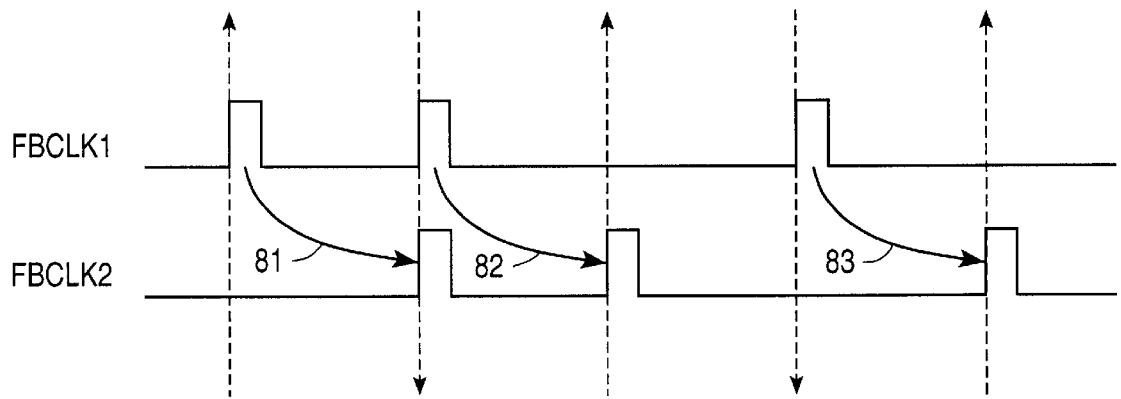
FIG. 9 is a timing diagram showing signal timing relationships for the circuit of FIG. 8.
Figure 10:
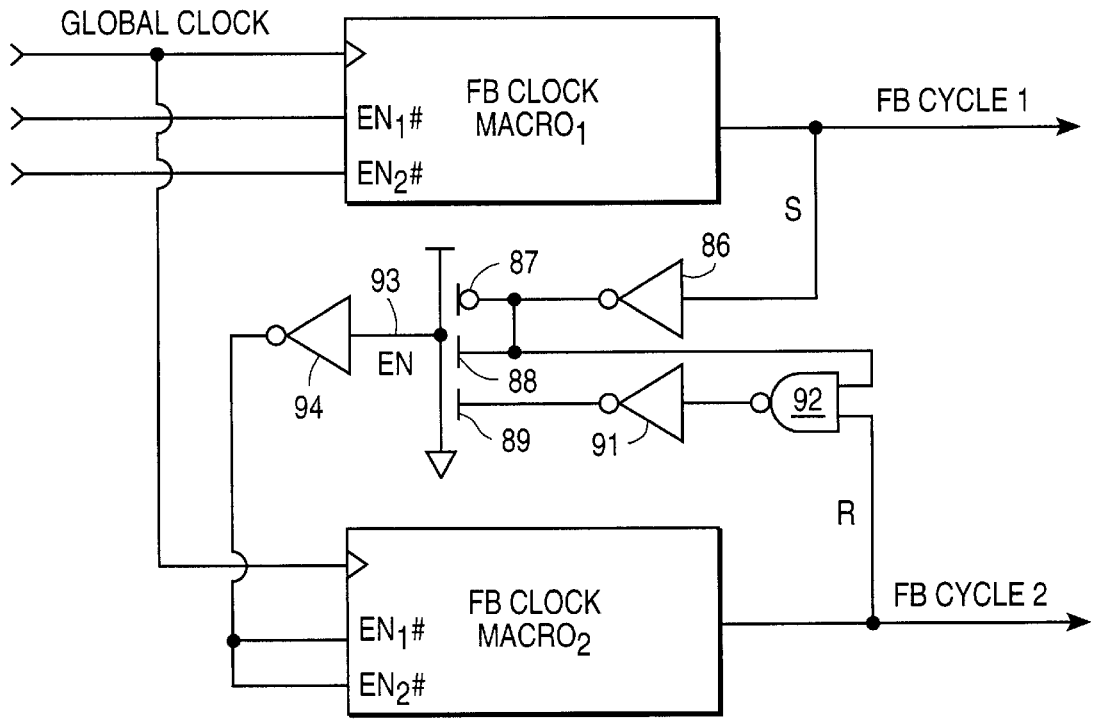
FIG. 10 is a circuit schematic diagram of an embodiment of the present invention suitable for use with the clock macro circuit of FIG. 8.

FIG. 9 is a timing diagram illustrating the operation of the circuit of FIG. 10, which utilizes the clock macros of FIG. 8. In FIG. 9, the rising and falling edges of GCLK are shown by the corresponding vertical dashed arrows. In this circuit configuration each pulsed output of clock macro₁ enables a clock pulse to be generated at the output of the successive macro stage (e.g., clock macro₂) responsive to the next transition (either rising or falling) of GCLK. In other words, two pulses are produced in each complete global clock cycle. The causal relationship between the clock output pulses is shown in FIG. 9 by arrows 81–83.

FIG. 10 shows an embodiment of the control circuit of the present invention that is suitable for use in conjunction with clock macro circuits that function in the manner shown in FIG. 9. The control circuit of FIG. 10 comprises a set dominant latch that includes a PMOS device 87 coupled between a supply potential (e.g., $V_{cc}$) and node 93. Node 93 is coupled though inverter 94 to both of the enable inputs (EN$_1$# and EN$_2$#) of clock macro$_2$. The set dominant latch further comprises a pair of NMOS devices 17 and 18 coupled in series between node 93 and ground. The gates of PMOS device 87 and NMOS device 88 are both connected to the output of an inverter 86, which also drives one input of NAND gate 92. The input of inverter 86 is coupled to the FB_cycle$_1$ output of clock macro$_1$. The gate of NMOS device 89 is coupled to the output of inverter 91. The input of inverter 91 is driven by the output of NAND gate 92, which has its other input coupled to the FB_cycle$_2$ output of clock macro$_2$.

In basic operation, the control circuit of FIG. 10 functions to change the state of node 93 in response to the rising and falling edges of FB_cycle$_1$. Node 93 is normally precharged high. When FB_cycle$_1$ transitions high, node 93 goes high, and clock macro$_2$ is enabled. Node 93 stays high until FB_cycle$_2$ transitions high. With FB_cycle$_1$ low and FB_cycle$_2$ high, the output of NAND gate 92 goes low so that inverter 91 turns on NMOS device 89. NMOS device is already on, so node 93 discharges and clock macro$_2$ is disabled.

If both FB_cycle$_1$ and FB_cycle$_2$ fire at the same time, the set dominant latch mechanism of the control circuit grants priority to device 88 over device 89. This keeps clock macro$_2$ enabled for the next cycle.

For certain circuit applications is may be desirable to generate two consecutive clock pulses, each synchronous with an edge of a global clock signal, in response to the clock pulse output of a preceding stage. A simple example is where a first clock pulse is utilized to perform a calculation, and the second consecutive clock pulse is used to clear the data. Such a scenario is illustrated in the timing diagram of FIG. 12, where two consecutive pulses are produced at each of the cycle$_2$ and cycle$_3$ outputs responsive to the initial pulse firing, i.e., cycle$_1$.

Figure 11:
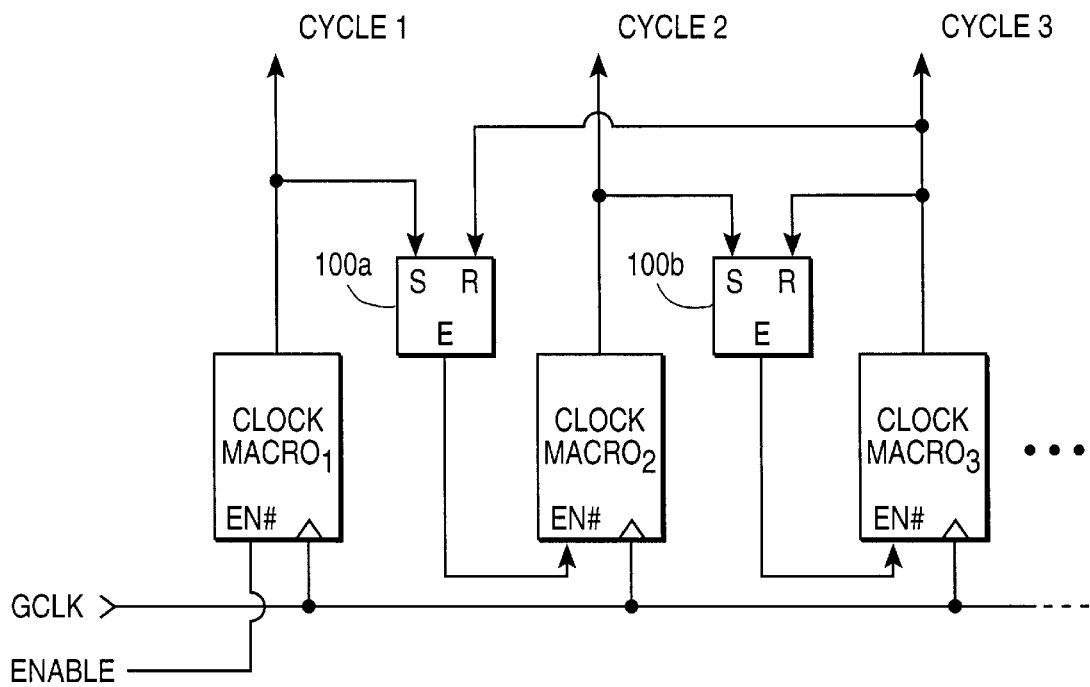
FIG. 11 illustrates a pipeline logic arrangement in accordance with a particular embodiment of the present invention.
Figure 12:
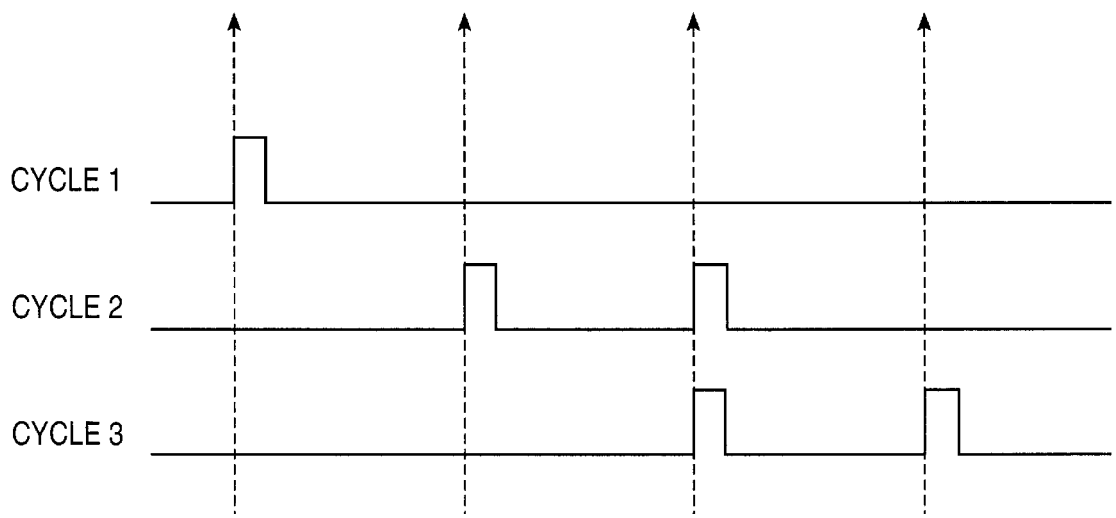
FIG. 12 is a timing diagram associated with the circuit of FIG. 11.

FIG. 11 is a circuit schematic diagram illustrating how the control circuit of FIG. 10 may be utilized to produce the timing relationship shown in FIG. 12. Blocks 100 represent the control circuit elements in FIG. 11. Each control circuit 100 comprises a set (S) input, a reset (R) input, and an enable (E) output. (The corresponding control circuit connection points are indicated in FIG. 10 by appropriate reference letters.) Note that in FIG. 11, the set input of control circuit 100a is coupled to the cycle$_1$ output of clock macro$_1$, but the reset input is connected to the cycle$_3$ output of clock macro$_3$ rather than the cycle$_2$ output of clock macro$_2$. The enable output of circuit 100a is coupled to the EN# input of clock macro$_2$.

Similarly, the set input of control circuit 100b is coupled to the cycle$_2$ output of clock macro$_2$, and the reset input of control circuit 100b is connected to the cycle$_3$ output of clock macro$_3$. In other words, by configuring the pipeline so that the reset signal is provided by the second next macro stage down the pipeline, a timing relationship such as that shown in FIG. 12, may be produced.

Figure 13:
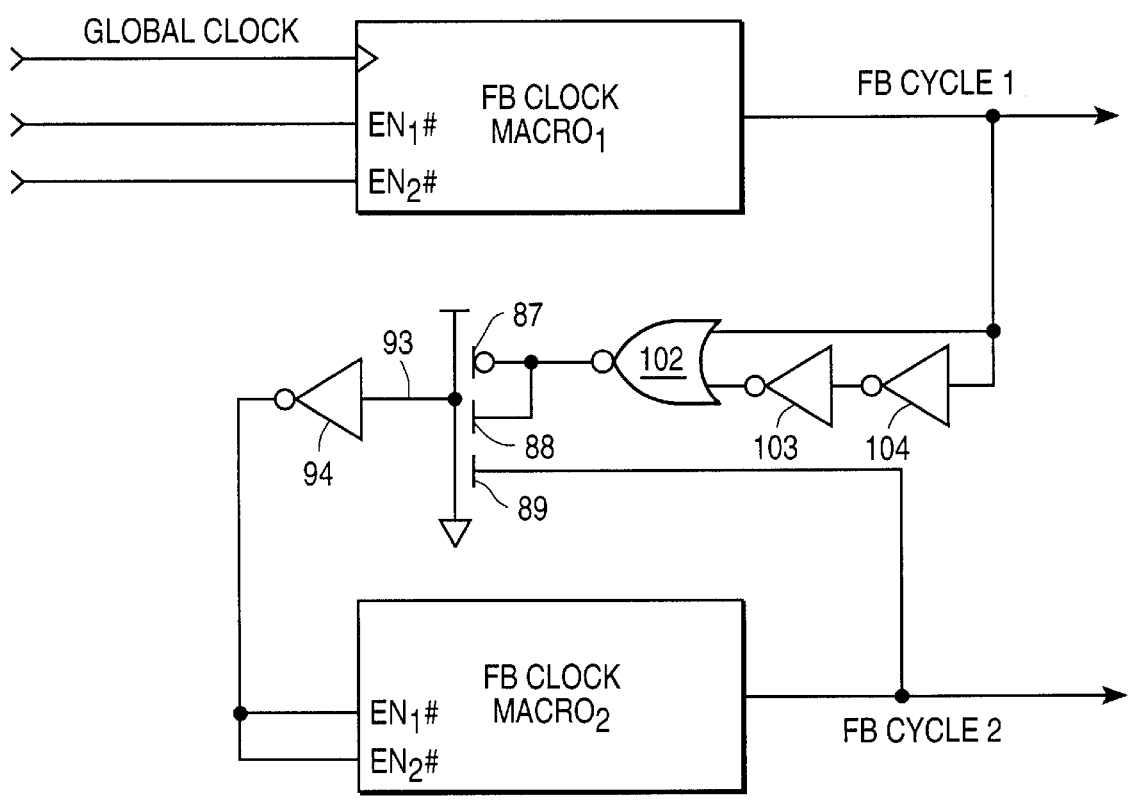
FIG. 13 is a circuit schematic diagram of an alternative embodiment of the present invention suitable for use with the clock macro circuit of FIG. 8.

FIG. 13 illustrates an alternative embodiment of a control circuit for staged enabling in conjunction with a clock macro circuit such as that shown in FIG. 8. The circuit of FIG. 13 is essentially the same as that shown previously in FIG. 10, except for the logic devices that provide the inputs to devices 87–89. In FIG. 13, the gate of device 89 is connected directly to the FBcycle$_2$ output of clock macro$_2$. The gates of devices 87 and 88 are coupled to the output of NOR gate 102, which has one input connected directly to the FBcycle$_1$ output of clock macro$_2$, and another input coupled to the FBcycle$_1$ output through series connected inverters 102 and 104. The operation of the control circuit shown in FIG. 13 is basically the same as that described for FIG. 10.

I claim:

1. A control circuit for clock enable staging between first and second clock macros, each clock macro producing a clock signal at an output in response to a transition of a global clock signal when an enable signal is activated, the control circuit comprising a latch element having a first input coupled to the output of the first clock macro, a second input coupled to the output of the second clock macro, and an output node coupled to the enable input of the second clock macro; the output node of the latch element activating the enable input of the second clock macro responsive to the clock signal at the output of the first clock macro; the output node of the latch element de-activating the enable input of the second clock macro responsive to the clock signal at the output of the second clock macro.

2. The control circuit of claim 1 wherein cycle-to-cycle staging is provided between the first and second clock macros, and further wherein the latch element comprises a set dominant latch with the first input having priority over the second input such that when both the first and second inputs are high, the output node is set to activate the enable input of the second clock macro.

3. The control circuit of claim 2 wherein the set dominant latch comprises a PMOS device coupled between a supply potential and the output node, and first and second NMOS devices coupled in series between the output node and ground, the gates of the PMOS and first NMOS device comprising the first input, and the gate of the second NMOS device comprising the second input.

4. The control circuit of claim 3 further comprising at least one inverter coupled between the output of the first clock macro and the first input of the set dominant latch.

5. The control circuit of claim 3 further comprising first, second, and third inverters coupled in series between the output of the first clock macro and the first input of the set dominant latch.

6. The control circuit of claim 5 wherein the enable input of the second clock macro is activated low, and further comprising a fourth inverter coupled between the output node and the enable input of the second clock macro.

7. The control circuit of claim 1 wherein next phase staging is provided between the first and second clock macros, and further wherein the latch element comprises a PMOS device coupled between a supply potential and the output node, and a NMOS device coupled between the output node and ground, the gate of the NMOS device comprising the first input, and the gate of the PMOS device comprising the second input of the latch element.

8. The control circuit of claim 7 further comprising an inverter coupled between the output of the second clock macro and the second input of the latch element.

9. The control circuit of claim 8 wherein the clock signal is produced at the output of the second clock macro responsive to a falling edge transition of the global clock signal when the enable input is active low.

10. A control circuit that provides cycle-to-cycle staging for a pipelined set of clock macros including first, second, and third clock macros, each having a clock output and an enable input, the second clock macro outputting a pair of consecutive clock signals, each of which is produced concurrent with a transition of a global clock signal when the enable input of the second clock macro is activated, the control circuit comprising a latch element having a set input coupled to the clock output of the first clock macro, a reset input coupled to the clock output of the third clock macro, and an output node coupled to the enable input of the second clock macro; the output node of the latch element activating the enable input of the second clock macro responsive to the clock signal at the output of the first clock macro; the output node being inactivated responsive to the clock signal at the output of the third clock macro.

11. The control circuit of claim 10 wherein the latch element comprises a set dominant latch with the first input having priority over the second input such that when both the first and second inputs are high, the output node is set to activate the enable input of the second clock macro.

12. The control circuit according to claim 11 wherein the set dominant latch comprises a PMOS device coupled between a supply potential and the output node, and first and second NMOS devices coupled in series between the output node and ground, the gates of the PMOS and first NMOS device comprising the first input, and the gate of the second NMOS device comprising the second input.

13. The control circuit according to claim 12 further comprising at least one inverter coupled between the output of the first clock macro and the first input of the set dominant latch.

14. The control circuit according to claim 12 further comprising first, second, and third inverters coupled in series between the output of the first clock macro and the first input of the set dominant latch.

15. The control circuit according to claim 14 wherein the enable input of the second clock macro is activated low, and further comprising a fourth inverter coupled between the output node and the enable input of the second clock macro.

16. A control circuit for clock enable staging between first and second clock macros, each clock macro having first and second enable inputs and an output, each producing a clock signal at the output in response to either a first transition of a global clock signal when the first enable input is activated, or a second transition of the global clock signal when the second enable input is activated, the control circuit comprising a latch element having a first input coupled to the output of the first clock macro, a second input coupled to the output of the second clock macro, and an output node coupled to the first and second enable inputs of the second clock macro; the output node of the latch element activating the first and second enable inputs of the second clock macro responsive to the clock signal at the output of the first clock macro; the output node of the latch element de-activating the first and second enable inputs of the second clock macro responsive to the clock signal at the output of the second clock macro, except when the clock signal is concurrently present at the output of the first clock macro.

17. The control circuit of claim 16 wherein the latch element comprises a set dominant latch with the first input having priority over the second input such that when both the first and second inputs are high, the output node is set to activate the first and second enable inputs of the second clock macro.

18. The control circuit of claim 17 wherein the set dominant latch comprises a PMOS device coupled between a supply potential and the output node, and first and second NMOS devices coupled in series between the output node and ground, the gates of the PMOS and first NMOS device comprising the first input, and the gate of the second NMOS device comprising the second input.

19. The control circuit according to claim 18 further comprising at least one inverter coupled between the output of the first clock macro and the first input of the set dominant latch.

20. The control circuit according to claim 19 further comprising a NAND gate driving a second inverter, the output of the second inverter being coupled to the second input of the set dominant latch, the NAND gate having a first input coupled to the output of the second clock macro and a second input coupled to the output of the first input of the set dominant latch.

21. The control circuit of claim 20 wherein the first and second enable inputs of the second clock macro are each activated low, and further comprising a fourth inverter coupled between the output node and the first and second enable inputs of the second clock macro.

22. The control circuit of claim 17 further comprising a NOR gate that drives the first input of the set dominant latch and a pair of inverters coupled in series between the output of the first clock macro and a first input of the NOR gate.

23. A pipelined logic circuit comprising:

first and second clock macros each having a clock input, an enable input and an output, each clock macro producing a clock signal at the output in response to a transition of a global clock signal coupled to the clock input when the enable input is activated;

an asynchronous circuit element for clock enable staging between the first and second clock macros, the asynchronous circuit element having a first input coupled to the output of the first clock macro, a second input coupled to the output of the second clock macro, and an output node coupled to the enable input of the second clock macro; the output node activating the enable input of the second clock macro responsive to the clock signal at the output of the first clock macro; the output node de-activating the enable input of the second clock macro responsive to the clock signal at the output of the second clock macro.

24. The pipelined logic circuit of claim 23 wherein the asynchronous circuit element comprises a set dominant latch.

25. The pipelined logic circuit of claim 23 wherein the asynchronous circuit element comprises a set-reset flip-flop.

26. The pipelined logic circuit of claim 24 wherein the set dominant latch has a first input and a second input, such that when both the first and second inputs are high the output node is set to activate the enable input of the second clock macro.

* * * * *

UNITED STATES PATENT AND TRADEMARK OFFICE
CERTIFICATE OF CORRECTION

PATENT NO.    : 6,166,564
DATED         : December 26, 2000
INVENTOR(S)   : Rosen It is certified that error appears in the above-identified patent and that said Letters Patent is hereby corrected as shown below:

<u>Column 5,</u>
Line 62, delete "micro,", insert -- $micro_1$ --.

Signed and Sealed this

Fourth Day of June, 2002

*Attest:*

JAMES E. ROGAN
*Attesting Officer*      *Director of the United States Patent and Trademark Office*